US009006808B2

(12) United States Patent
Sun et al.

(10) Patent No.: US 9,006,808 B2
(45) Date of Patent: Apr. 14, 2015

(54) ELIMINATING SHORTING BETWEEN FERROELECTRIC CAPACITORS AND METAL CONTACTS DURING FERROELECTRIC RANDOM ACCESS MEMORY FABRICATION

(71) Applicant: Cypress Semiconductor Corporation, San Jose, CA (US)

(72) Inventors: Shan Sun, Monument, CO (US); Thomas E. Davenport, Denver, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/303,014

(22) Filed: Jun. 12, 2014

(65) Prior Publication Data

US 2015/0069481 A1 Mar. 12, 2015

Related U.S. Application Data

(60) Provisional application No. 61/875,226, filed on Sep. 9, 2013.

(51) Int. Cl.
*H01L 49/02* (2006.01)
*H01L 27/115* (2006.01)

(52) U.S. Cl.
CPC .......... *H01L 28/56* (2013.01); *H01L 27/11502* (2013.01)

(58) Field of Classification Search
CPC .............. H01L 28/57; H01L 21/31122; H01L 21/32136; H01L 21/76838; H01L 27/11502; H01L 27/11507; H01L 28/55; H01L 28/60
USPC ........................................................ 257/295
See application file for complete search history.

(56) References Cited

U.S. PATENT DOCUMENTS

| | | | |
|---|---|---|---|
| 6,485,988 B2 | 11/2002 | Ma et al. | |
| 6,534,809 B2 | 3/2003 | Moise et al. | |
| 6,635,528 B2 | 10/2003 | Gilbert et al. | |
| 6,656,748 B2 | 12/2003 | Hall et al. | |
| 6,713,342 B2 | 3/2004 | Celii et al. | |
| 6,773,930 B2 | 8/2004 | Summerfelt et al. | |
| 6,828,161 B2 | 12/2004 | Summerfelt et al. | |
| 6,841,396 B2 | 1/2005 | Celii et al. | |
| 6,876,021 B2 | 4/2005 | Martin et al. | |
| 8,084,358 B2 * | 12/2011 | Yoshida | 438/638 |
| 8,212,300 B2 | 7/2012 | Nagai | |
| 8,264,063 B2 * | 9/2012 | Shioga et al. | 257/532 |
| 2002/0006674 A1 * | 1/2002 | Ma et al. | 438/3 |
| 2010/0261296 A1 | 10/2010 | Izumi | |

OTHER PUBLICATIONS

Jang, et al., "Highly Stable Etch Stopper Technology for 0.25 um 1 Transistor 1 Capacitor (1T1C) 32 Mega-Bit Ferroelectric Random Access Memory (FRAM)", Jpn. J. Appl. Phys. vol. 42 (2003) pp. 2033-2036, Part 1, No. 4B, Apr. 2003, The Japan Society of Applied Physics, 5 pages.
International Technology Roadmap for Semiconductors, 2005 Edition, Interconnect, URL: http://www.itrs.net/Links/2005itrs/Interconnect2005.pdf, 64 pages.
Patentability Search Report for Reference No. CD13047. Apr. 16, 2014, 9 pages.
International Search Report for International Application No. PCT/US14/52058 dated Sep. 10, 2014; 2 pages.
Written Opinion of the International Searching Authority for International Application No. PCT/US14/52058 dated Sep. 10, 2014; 8 pages.

* cited by examiner

*Primary Examiner* — Walter H Swanson
(74) *Attorney, Agent, or Firm* — Lowenstein Sandler LLP

(57) ABSTRACT

Disclosed herein is an apparatus that includes a ferrocapacitor having a sidewall. An etch stopping film is disposed along the sidewall of the ferrocapacitor, with a hydrogen barrier film disposed between the etch stopping film and the sidewall of the ferrocapacitor.

19 Claims, 14 Drawing Sheets

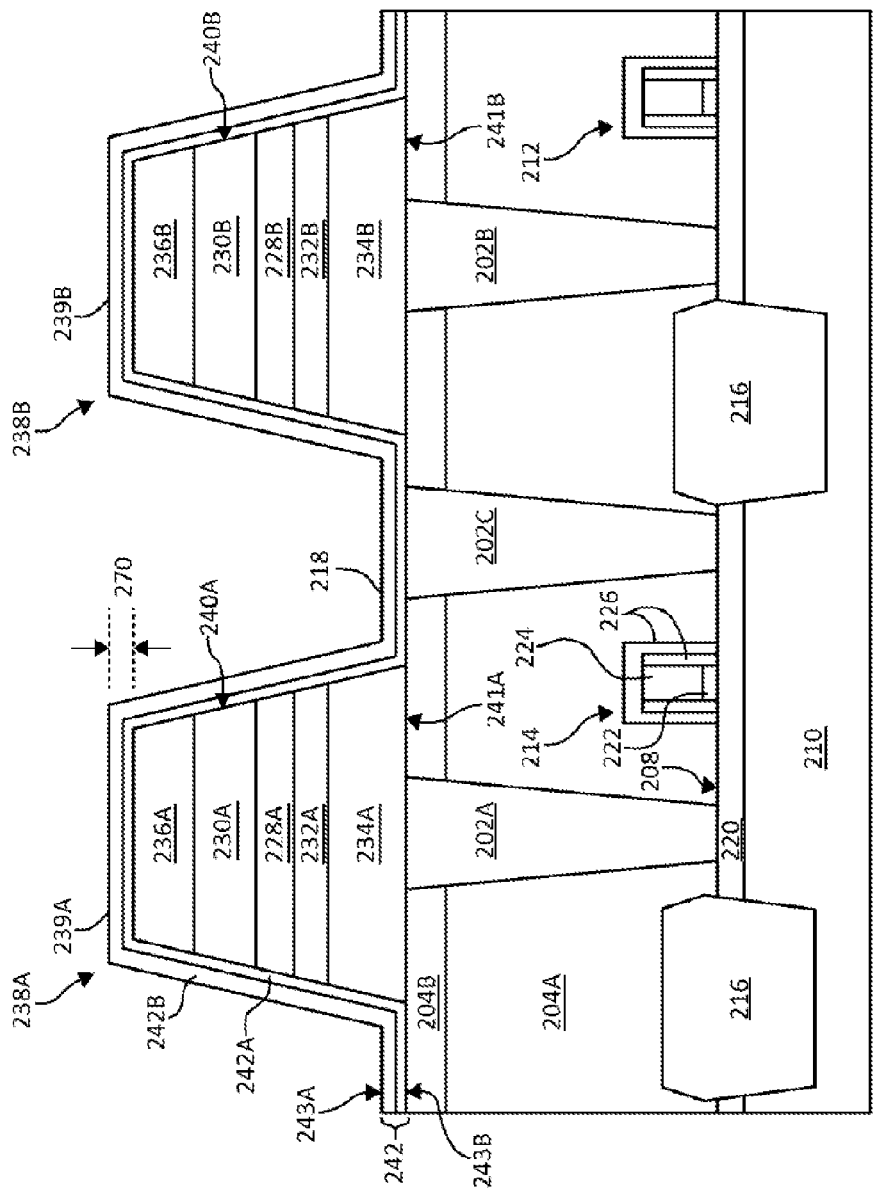

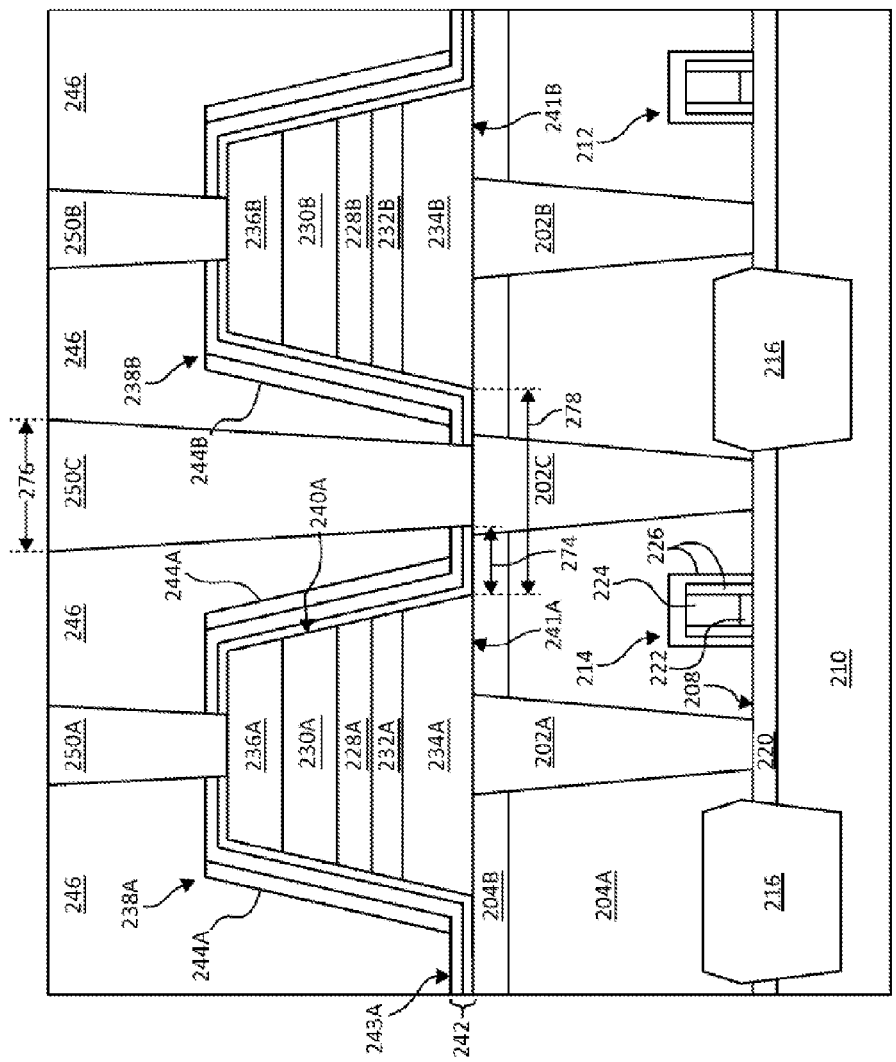

ELIMINATING SHORTING BETWEEN FERROELECTRIC CAPACITORS AND METAL CONTACTS DURING FERROELECTRIC RANDOM ACCESS MEMORY FABRICATION

CROSS REFERENCE TO RELATED APPLICATION

This application claims the benefit of priority of U.S. Provisional Patent Application No. 61/875,226, filed Sep. 9, 2013, which is hereby incorporated by reference herein in its entirety.

TECHNICAL FIELD

Embodiments described herein relate to semiconductor devices, and more particularly to the fabrication of ferroelectric random access memory devices.

BACKGROUND

Ferroelectric random-access memories (FRAM) typically include a grid or an array of storage elements or cells, each including at least one ferroelectric capacitor and one or more associated transistors to select the cell and control reading or writing thereto. When an external electric field is applied across a ferroelectric material of a ferroelectric capacitor in the cell, dipoles in the material align with the field direction. After the electric field is removed, the dipoles retain their polarization state. Data is stored in the cells as one of two possible electric polarizations in each data storage cell. For example, in a one transistor-one capacitor (1T1C) cell, a "1" may be encoded using a negative remnant polarization, and a "0" may be encoded using a positive remnant polarization.

The ferroelectric capacitor in an FRAM cell typically includes a ferroelectric material, such as lead zirconate titanate (PZT) between an upper electrode and a lower electrode. The transistors in the cells are typically metal-oxide-semiconductor (MOS) transistors fabricated using a standard or baseline complimentary-metal-oxide-semiconductor (CMOS) process flows, involving the formation and patterning of conducting, semiconducting, and dielectric materials. The composition of these materials, as well as the composition and concentration of processing reagents, and temperature used in such a CMOS process flow are stringently controlled for each operation to ensure that the resultant MOS transistors function properly. Materials and processes typically used to fabricate the ferroelectric capacitor differ significantly from those of the baseline CMOS process flow, and can detrimentally impact the MOS transistors.

Moreover, stringent design rules may be utilized when fabricating interconnect layers to interface the ferroelectric components with CMOS layers, as the potential for defects and errors in the manufacturing process (e.g., misalignments) increases with the number of subsequent processing steps.

BRIEF DESCRIPTION OF THE DRAWINGS

The present invention will be understood more fully from the detailed description that follows and from the accompanying drawings and the appended claims provided below, where:

FIGS. 2A-2H illustrate cross sectional views of portions of FRAM cells during the fabrication thereof according to one embodiment of the present invention;

DETAILED DESCRIPTION

Non-volatile memory cells including complimentary metal-oxide-semiconductor (CMOS) transistors and embedded ferroelectric capacitors formed according to methods of the present disclosure include protective etch stopping films into the devices during fabrication to prevent electrical shorting that may occur as a result of downstream processing errors, thus lowering defect density and allowing for tighter design rules.

In one embodiment, an apparatus includes a first ferroelectric capacitor (or "ferrocapacitor") having an upper surface and a sidewall. A hydrogen barrier film, having an outer surface and an inner surface, is disposed along the sidewall of the first ferrocapacitor such that the inner surface of the hydrogen barrier film is in contact with the sidewall of the ferrocapacitor. An etch stopping film is disposed along the outer surface of the hydrogen barrier film.

In another embodiment, an apparatus includes a substrate with a first dielectric layer disposed thereon. The first dielectric layer has a top surface with a first and second ferrocapacitor disposed along the top surface. The first ferrocapacitor has a first outer surface with a first etch stopping film disposed along the first outer surface. The second ferrocapacitor has a second outer surface with a second etch stopping film disposed along the second outer surface. A minimum distance between the first and second outer surfaces of the respective first and second ferrocapacitors is between 300 nanometers and 425 nanometers.

In another embodiment, a method comprises providing a ferrocapacitor having a sidewall and a hydrogen barrier film disposed along the sidewall. An etch stopping film is formed on the outer surface of the hydrogen barrier along the sidewall of the ferrocapacitor.

Embodiments of FRAM cells including protective etch stopping films to prevent electrical shorting during fabrication and methods of fabricating the same are described herein with reference to figures. Specifically, the etch stopping films may be disposed along sidewalls of ferrocapacitors within a dielectric layer. The etch stopping films etch slower than the dielectric layer, such that if openings etched into the dielectric layer are misaligned and overlap with the ferrocapacitors, the etch stopping films prevent the ferrocapacitors from being etched and exposed to subsequently deposited metal interconnects. It is noted that particular embodiments may be practiced without one or more of these specific details, or in combination with other known methods, materials, and apparatuses.

Figure 1:
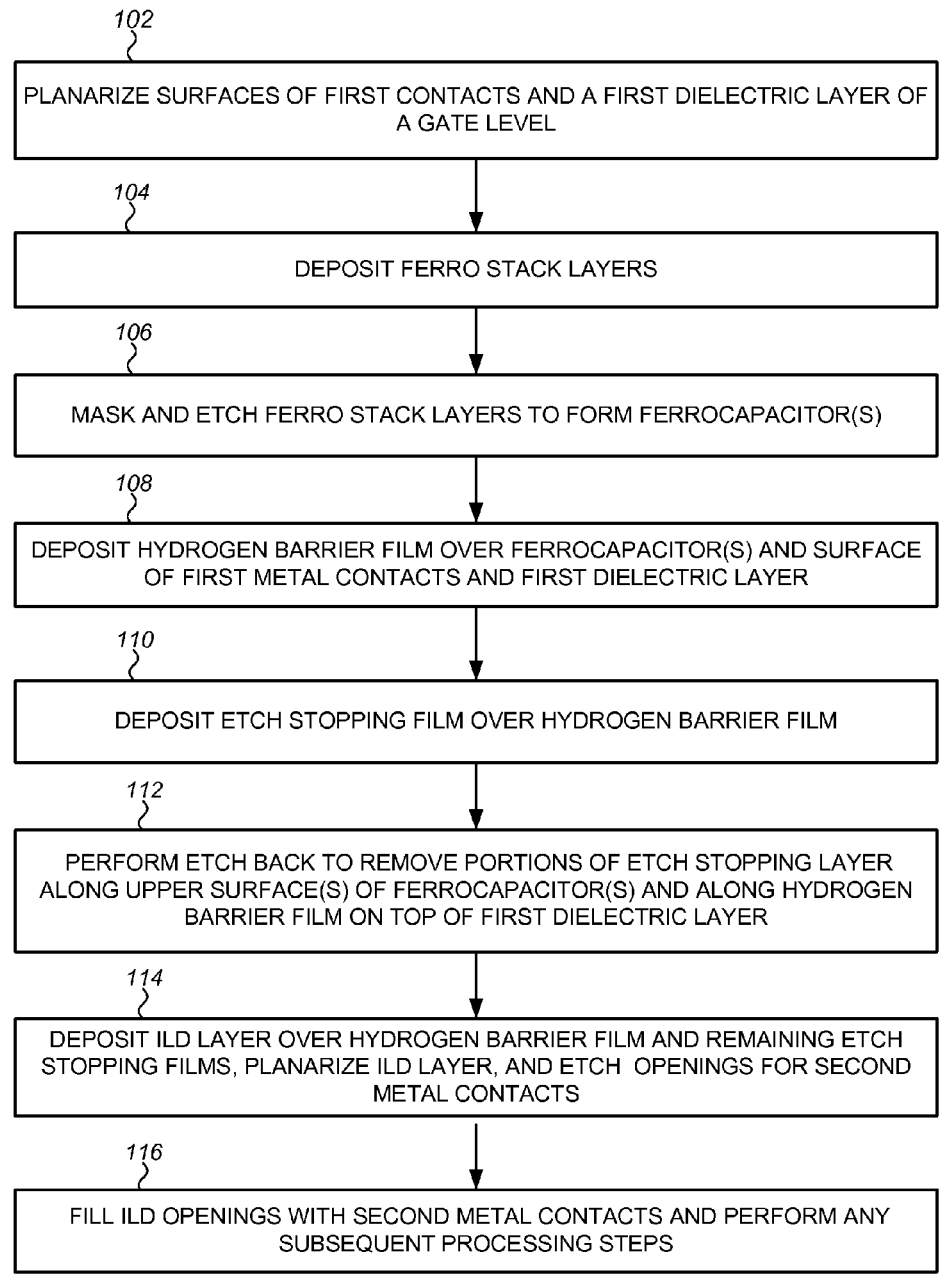
FIG. 1 is a flow diagram illustrating a method for fabricating FRAM cells according to one embodiment of the present invention.

An embodiment of an apparatus including FRAM cells having protective etch stopping films disposed along the sidewalls of ferrocapacitors of the FRAM cells, and a method of fabricating and integrating such ferroelectric capacitors into a standard or baseline CMOS process flow will now be described in detail with reference to FIG. 1 and FIGS. 2A through 2H. FIG. 1 is a flow diagram illustrating a method for fabricating FRAM cells according to one embodiment of the present invention. FIGS. 2A-2H illustrate cross sectional views of portions of FRAM cells during the fabrication thereof according to one embodiment of the present invention.

Figure 2A:
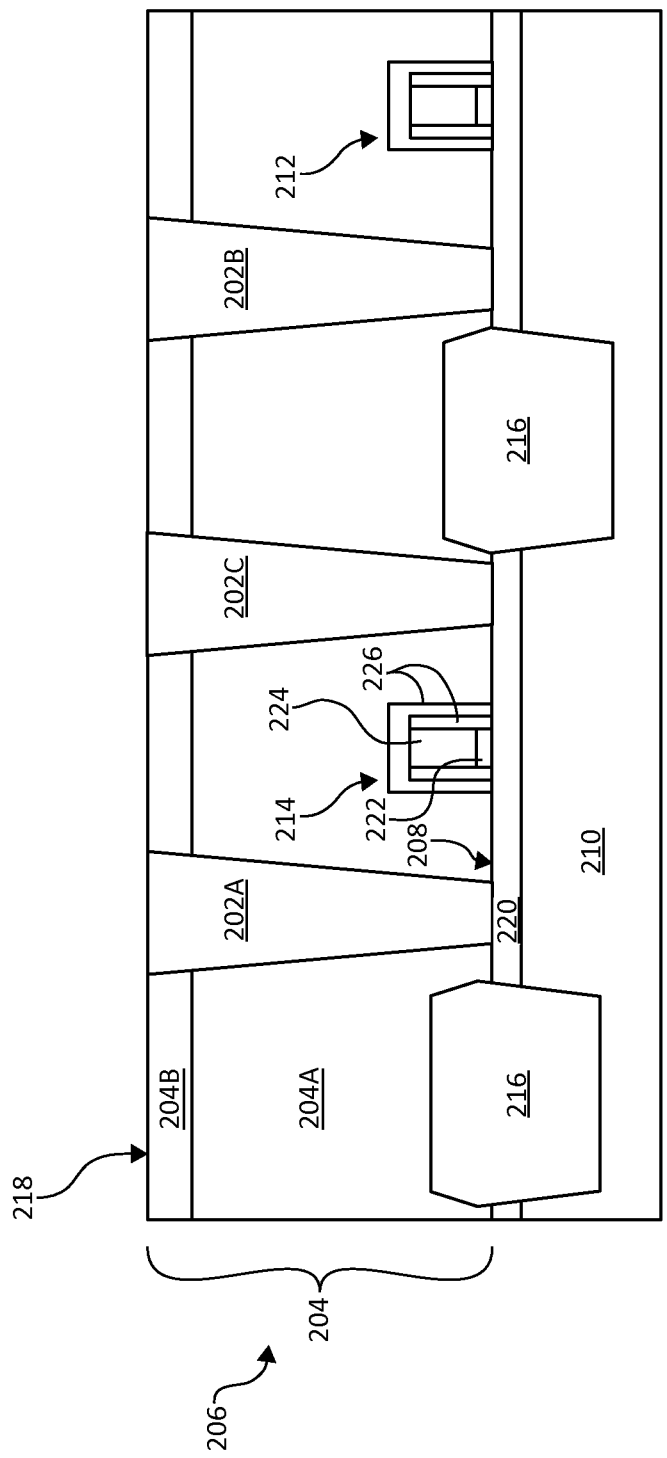

Referring to FIG. 1 and FIG. 2A, the process begins at block 102 with planarizing surfaces of lower metal contacts 202a-c and an inter-metal dielectric or first dielectric layer 204 after formation of a gate level layer 206 on a surface 208 of a substrate 210. The gate level includes gate stacks of one or more metal-oxide-semiconductor (MOS) transistors 212, 214 separated by one or more isolation structures 216. The first dielectric layer 204 overlays the MOS transistors 212, 214 and the lower metal contacts 202a-c extending through the first dielectric layer 204 from a top surface 218 thereof to a diffusion region 220, such as a source or a drain, in the MOS transistor 214 on the substrate 210.

In addition to a source and a drain, diffusion regions 220 can also include a channel region. Generally, the substrate 210 and, hence, diffusion regions 220, may be composed of any material suitable for semiconductor device fabrication. In one embodiment, the substrate 210 is a bulk substrate composed of a single crystal of a material which may include one or more of, but is not limited to, silicon, germanium, silicon-germanium, or an III-V compound semiconductor material. In another embodiment, the substrate 210 includes a bulk layer with a top epitaxial layer. In another embodiment, a bulk layer is composed of a single crystal of a material which may include one or more of, but is not limited to, silicon, germanium, silicon-germanium, a III-V compound semiconductor material, or quartz, while a top epitaxial layer is composed of a single crystal layer which may include one or more of, but is not limited to, silicon, germanium, silicon-germanium, or a III-V compound semiconductor material. The top epitaxial layer may be composed of a single crystal layer which may include one or more of, but is not limited to, silicon (i.e., to form a silicon-on-insulator (SOI) semiconductor substrate), germanium, silicon-germanium, or an III-V compound semiconductor material. An insulator layer may be composed of a material which may include one or more of, but is not limited to, silicon dioxide, silicon nitride, or silicon oxy-nitride. A lower portion of the bulk layer may be composed of a single crystal which may include one or more of, but is not limited to, silicon, germanium, silicon-germanium, an III-V compound semiconductor material, or quartz. Alternatively, the substrate 210, bulk layer, top epitaxial layer and the insulator material may be composed of other materials.

The substrate 210 and, hence, the channel region, may include dopant impurity atoms. In one embodiment, the channel region is doped P-type silicon and, and in another embodiment, the channel region is doped N-type silicon. Source and drain diffusion regions 220 in the substrate 210 have opposite conductivity to the channel region. For example, in one embodiment, the substrate 210 and, hence, the channel region, is composed of boron-doped single-crystal silicon having a boron concentration in the range of $1 \times 10^{15}$-$1 \times 10^{19}$ atoms/$cm^3$. Source and drain diffusion regions 220 may be composed of phosphorous- or arsenic-doped regions having a concentration of N-type dopants in the range of $5 \times 10^{16}$-$5 \times 10^{19}$ atoms/$cm^3$. Generally, source and drain diffusion regions 220 have a depth in the substrate 210 in the range of 80-200 nanometers (nm). In accordance with an alternative embodiment of the present disclosure, source and drain diffusion regions 220 are P-type doped regions while the substrate 210 and channel region is an N-type doped region.

The MOS transistor 214 may include a gate oxide 222 formed on the surface 208 of the substrate 210, a gate layer 224 formed on the gate oxide 222, and one or more sidewall spacers 226 isolating the gate layer 224 from the first dielectric layer 204. Additionally, it is to be understood by those skilled in the art that the gate layer 224 is generally electrically coupled to an overlying local interconnect, which is described in more detail below.

The first dielectric layer 204 can include a single layer of dielectric material or multiple layers of dielectric material. For example, in one embodiment the first dielectric layer 204 includes a lower or bottom first dielectric layer 204a, which may include phosphosilicate glass (PSG) formed or deposited by a chemical vapor deposition (CVD) process, such as plasma or low pressure or atmospheric CVD. The first dielectric layer 204 may also include an upper or top first dielectric layer 204b, which may include a silicon oxide deposited by low pressure CVD (LPCVD) using tetraethyl-orthosilicate (TEOS) based process gas or precursors. Alternatively, other deposition chemistries may be used.

The lower metal contacts 202a-c may be formed by performing a contact etch to etch the first dielectric layer 204 and expose the underlying diffusion regions 220, followed by filling the openings formed with a conductive material, typically a refractory metal. The contact etch can be accomplished using standard photolithographic techniques and any suitable wet or dry etching chemistry for etching a silicon oxide and/or PSG. Suitable contact etch chemistries can include, for example, wet etching using hydrofluoric acid (HF), or gas phase etching (GPE) using a reactive ion etch (RIE) process gas. Alternatively, other contact etch chemistries may be used. Contact openings formed in the first dielectric layer 204 are filled with a refractory metal. The term "refractory metal" refers to a metal of elements of the groups 4, 5 and 6 of the periodic table, including titanium (Ti), tantalum (Ta), tungsten (W), and nitrides or alloys thereof, which are resistant to high temperatures. The refractory metal can be deposited, for example, by physical vapor deposition (PVD), such as sputtering or evaporation, or by CVD and electroless plating.

As indicated in block 102 of FIG. 1, once formed, the surfaces of the lower metal contacts 202 and first dielectric layer 204 are planarized, for example, using a chemical mechanical polishing (CMP) process.

Figure 2B:
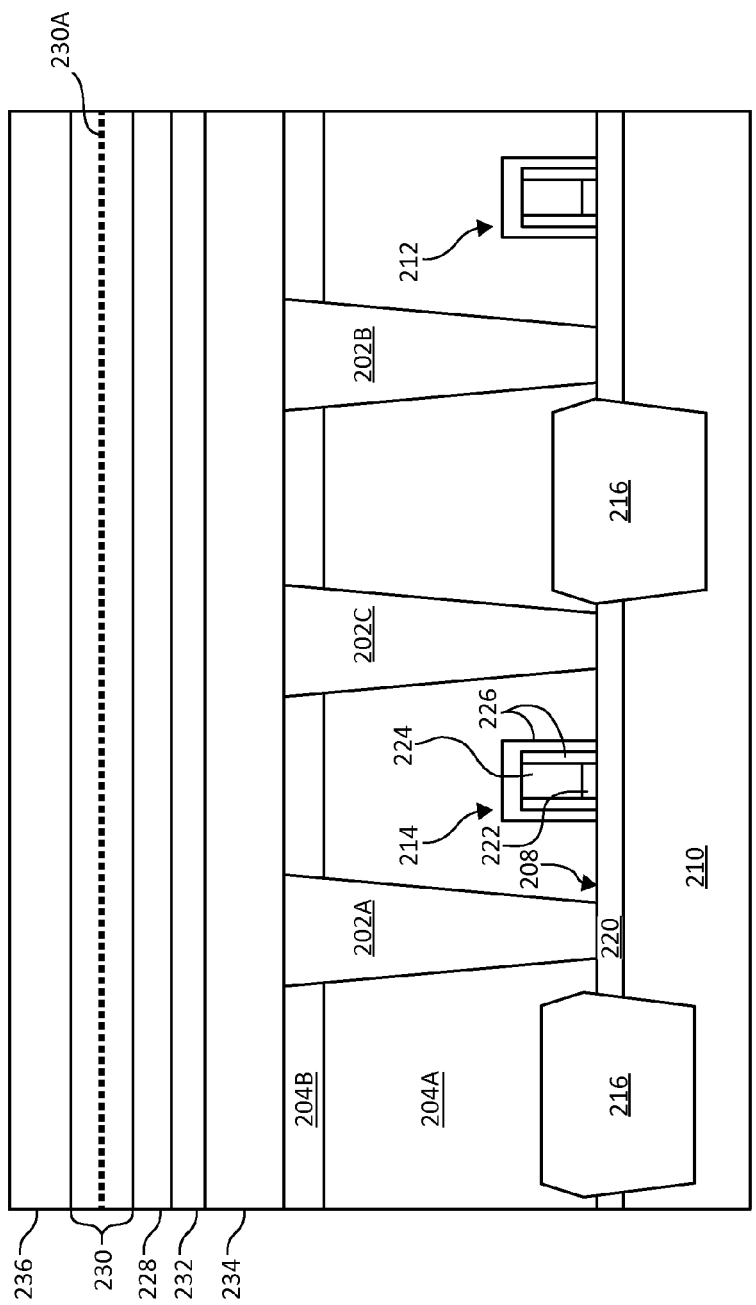

Referring to FIG. 1 and FIG. 2B, at block 104, layers of a ferro stack from which one or more ferroelectric capacitors will be formed are deposited or formed over the planarized surfaces of the lower metal contacts 202a-c and the first dielectric layer 204. Generally, the ferro stack layers includes a layer of a ferroelectric material, such as a lead zirconate titanate (PZT) ferroelectric layer 228, between a top electrode 230 and bottom electrode 232 in electrical contact with or electrically coupled to one of the underlying lower metal contacts 202a-c. In one embodiment, the ferro stack can further include an oxygen ($O_2$) barrier 234. The $O_2$ barrier 234 can include a layer of titanium aluminum nitride (TiAlN) or aluminum titanium nitride (AlTiN) having a thickness of from about 0.03 to about 0.30 µm, and can be deposited or formed using any suitable deposition method, such as CVD, atomic layer deposition (ALD), or PVD. The top electrode 230 and the bottom 232 electrodes can include one or more layers of iridium or iridium oxide having a thickness ranging from, for example, 0.05 to 0.30 µm, and can be deposited or formed using CVD, ALD or PVD. In one embodiment, the top electrode 230 is a multi-layer top electrode 230a including, for example, a lower layer of iridium oxide (IrO2) in contact with the PZT ferroelectric layer 228 and an upper layer of iridium (Ir) overlying the lower layer of the top electrode. The PZT ferroelectric layer 228 is deposited on the bottom electrode 232 to a thickness ranging from, for example, 0.04 to 0.30 µm using CVD, ALD or PVD. A hard mask 236 may be formed over the ferro stack layers. The hard mask 236 can include, for example, a layer of titanium aluminum nitride (TiAlN) having a thickness ranging from 0.10 to 0.40 µm, and can be deposited or formed using PVD. In certain embodiments, the hard mask 236 can include multiple layers and the material of the hard mask may be selected to form a hydrogen ($H_2$) barrier. Alternatively, other materials and methods may be used to fabricate the ferro stack layers.

Figure 2C:
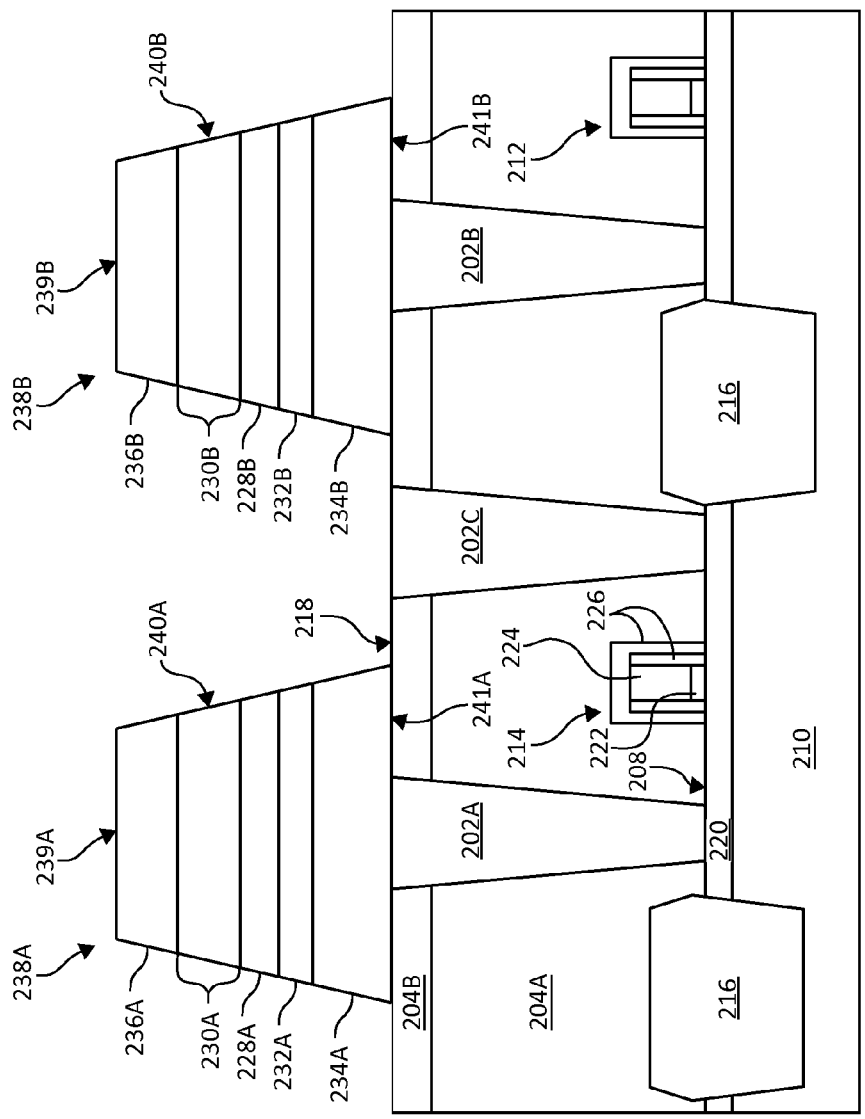

Referring to FIG. 1 and FIG. 2C, at block 106, the ferro stack layers may be patterned by first patterning the hard mask 236 and then using standard etching technologies, such as standard metal etch chemistries, to define first 238a and second 238b ferroelectric capacitors (or "ferrocapacitors"). The first ferrocapacitor 238a includes an $O_2$ barrier 234a, a bottom electrode 232a (which is electrically coupled to the lower metal contact 202a), a PZT ferroelectric layer 228a, a top electrode 230a, and a hard mask 236a, each of which correspond to their counterpart ferro stack layers. An upper surface 239a of the first ferrocapacitor 238a corresponds to an upper surface of the hard mask 236a, and a lower surface 241a of the first ferrocapacitor 238a contacts the lower metal contact 202a and the top surface 218 of the first dielectric layer 204. The first ferrocapacitor 238a also includes one or more sidewalls 240a that run from the upper surface 239a to the lower surface 241a. In one embodiment, the sidewalls 240a are slanted with respect to the top surface 218 of the first dielectric layer 204. In one embodiment, the first ferrocapacitor 238a may be a round structure (e.g., a cylinder, a tapered cylinder, etc.) in which the sidewall 240a defines a circumference of the first ferrocapacitor 238a. In one embodiment, the first ferrocapacitor 238a may be multi-walled of various shape (e.g., a cube, a trapezoid, an elongated cube, an elongated trapezoid, etc.) having multiple sidewalls 240a that define a perimeter. Alternatively, the first ferrocapacitor 238a may have different shapes.

Similarly, the second ferrocapacitor 238b includes an $O_2$ barrier 234b, a bottom electrode 232b (which is electrically coupled to the lower metal contact 202b), a PZT ferroelectric layer 228b, a top electrode 230b, and a hard mask 236b, each of which correspond to their counterpart ferro stack layers. An upper surface 239b of the second ferrocapacitor 238b corresponds to an upper surface of the hard mask 236b. A lower surface 241b of the second ferrocapacitor 238b contacts the lower metal contact 202b and the top surface 218 of the first dielectric layer 204, such that the first 238a and second 238b ferrocapacitors are both disposed along the top surface 218 of the first dielectric layer 204. The second ferrocapacitor 238a also includes one or more sidewalls 240a that run from the upper surface 239a to the lower surface 241a. In one embodiment, the sidewalls 240a are slanted with respect to the top surface 218 of the first dielectric layer 204. In one embodiment, the second ferrocapacitor 238a may be a round structure (e.g., a cylinder, a tapered cylinder, etc.) in which the sidewall 240a defines a circumference of the second ferrocapacitor 238a. In one embodiment, the second ferrocapacitor 238a may be multi-walled (e.g., a cube, a trapezoid, an elongated cube, an elongated trapezoid, etc.) having multiple sidewalls 240a that define a perimeter. Alternatively, the second ferrocapacitor 238b may have different shapes. It is noted that the two ferrocapacitors 238a, 238b are merely illustrative, and that any suitable number of ferrocapacitors may be fabricated in accordance with the present embodiments.

Referring to FIG. 1 and FIG. 2D, at block 108, one, two, or more layers of a hydrogen ($H_2$) barrier film 242 are deposited having an outer surface 243a and an inner surface 243b, such that the inner surface 243b of the hydrogen barrier film 242 contacts upper surfaces 239a, 239b and sidewalls 240a, 240b of the ferrocapacitors 238a, 238b, the top surface 218 of first dielectric layer 204, and the lower metal contacts 202c, encapsulating the ferrocapacitors 238a, 238b. Encapsulating the ferrocapacitors 238a, 238b in this way can prevent degradation that can occur when hydrogen is introduced during subsequent processing. The hydrogen barrier film 242 can include a single material layer, or multiple material layers, and can have an overall thickness 270 ranging from, for example, 10 nanometers to 130 nanometers. In one embodiment, the hydrogen barrier film 242 can include a lower or first hydrogen encapsulation layer 242a of aluminum oxide ($Al_2O_3$) having a thickness ranging from, for example, 5 to 30 nanometers, and may be deposited by ALD or PVD, and an upper or second hydrogen encapsulation layer 242b of silicon nitride (SiN) having a thickness ranging from, for example, 5 to 100 nanometers, and may be deposited by CVD or ALD. Alternatively, other techniques may be used to deposit the hydrogen barrier film 242.

Figure 2E:
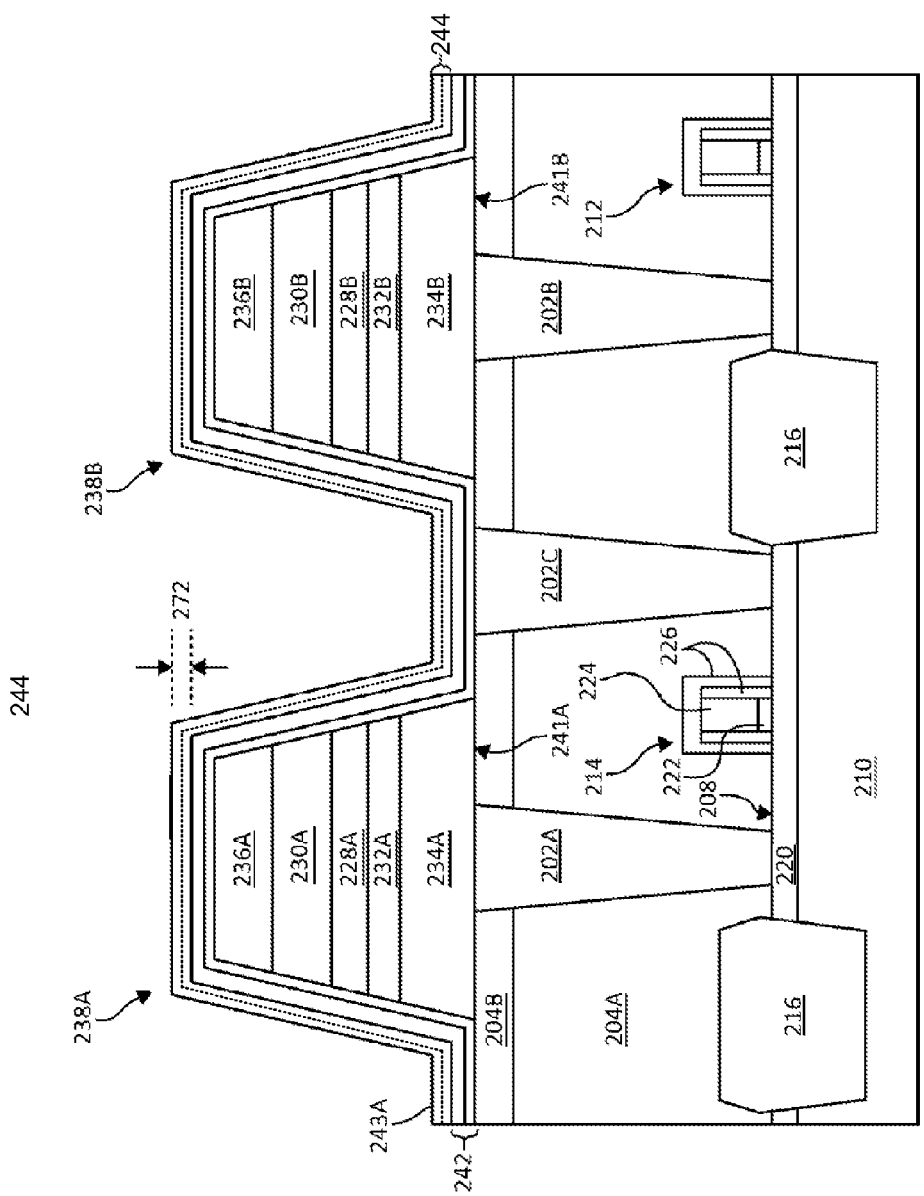

Referring to FIG. 1 and FIG. 2E, at block 110, an etch stopping film 244 is deposited over the outer surface 243a hydrogen barrier film 242. The etch stopping film 244 is deposited along the upper surfaces 239a, 239b of the ferrocapacitors 238a, 238b and along the sidewalls 240a, 240b with the hydrogen barrier film 242 disposed between. In one embodiment, the etch stopping film may be composed of one or more of SiN, SiON, titanium oxy-nitride (TiON), or titanium aluminum oxy-nitride (TiAlON). In one embodiment, the etch stopping film 244 may have a thickness 272 ranging from 10 nanometers to 100 nanometers, and may be deposited, for example, using PVD, CVD, or ALD. In one embodiment, the etch stopping film 244 is composed of a layer of TiAlON having a nitrogen to oxygen ratio that varies through the etch stopping film 244 from an inner surface of the etch stopping film 244 (e.g., a surface in contact with the outer surface 243a of the hydrogen barrier film 242) to an outer surface of the etch stopping film 244. In one embodiment, the nitrogen to oxygen ratio may vary between 0 (0% nitrogen and 100% oxygen) at the inner surface and 0.43 (30% nitrogen and 70% oxygen) at the outer surface. The nitrogen to oxygen ratio may be varied by regulating the nitrogen and oxygen gas flow conditions during the deposition of the etch stopping film 244. Varying the nitrogen and oxygen ratio in this way may cause the etch stopping film 244 to be more insulating near the inner surface by including more oxygen and less nitrogen, and more resistant to etching near the outer surface by including more nitrogen and less oxygen. In one embodiment, an annealing step may be performed to anneal the etch stopping film 244. For example, the etch stoppling film 244 may be annealed between 400-700° C. for 1 minute to 1 hour in oxygen. In some embodiments, the etch stopping film may include more than one layer (e.g. two or more layers), which may be composed of any suitable material as described above.

Figure 2F:
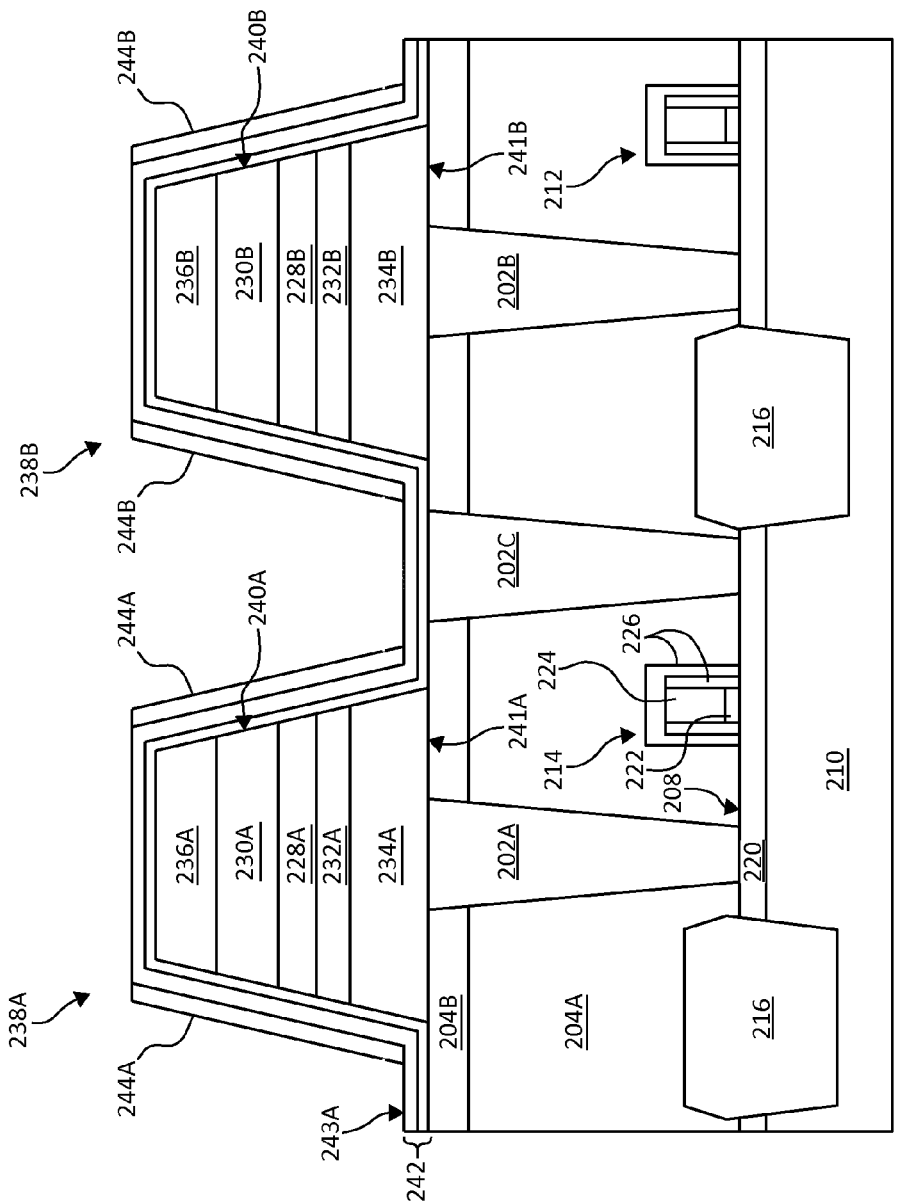

Referring to FIG. 1 and FIG. 2F, at block 112, an etch back is performed to remove portions of the etch stopping film 244 along the upper surfaces 239a, 239b of the ferrocapacitors 238a, 238b and along the outer surface 243a of the hydrogen barrier film 242 on top of the first dielectric layer 204. The etch back leaves behind etch stopping films 244a, 244b disposed along the sidewalls 240a, 240b of the respective ferrocapacitors 238a, 238b, with hydrogen barrier 242 located in between each of the etch stopping films 244a, 244b and their respective sidewalls 240a, 240b. In one embodiment, the etch back is performed using a plasma dry etching to anisotropically etch the portions of the etch stopping film 244 that are parallel to the substrate 210, while minimally etching the portions of the etch stopping film 244 disposed along the outer surface 243a of the hydrogen barrier film 242. The etch stop may be performed for just enough time to fully etch through the horizontal portions of the etch stopping film 244 without etching into the hydrogen barrier film 242. In alternative embodiments, other methods, such as photolithographic methods, may be used to remove portions of the etch stopping film 244.

Figure 2G:
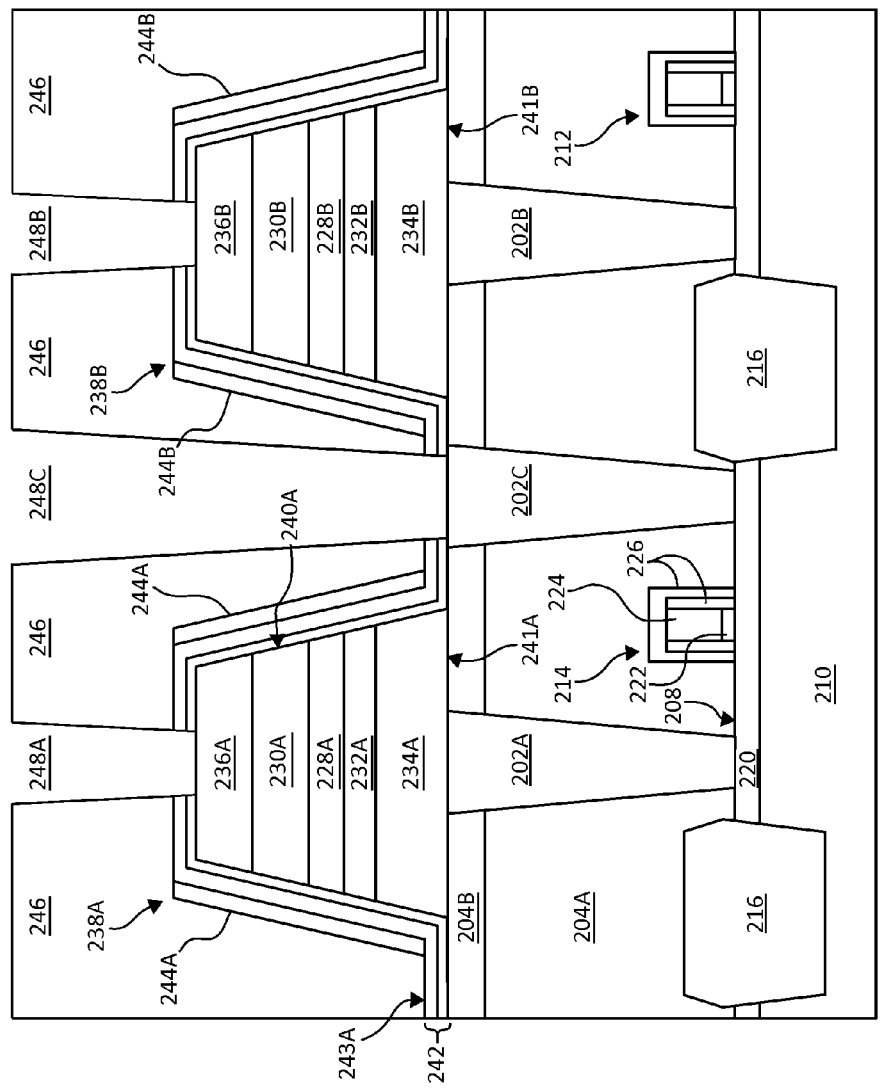

Referring to FIG. 1 and FIG. 2G, at block 114, an inter-level dielectric (ILD) layer 246 is deposited or formed over the hydrogen barrier film 242 and etch stopping films 244a, 244b. The ILD layer 246 is planarized, and openings 248a, 248b for metal contacts are etched through the ILD layer 246 and hydrogen barrier film 242 to reveal the hard masks 236a, 236b and allow for electrical coupling of the top electrodes 230a, 230b of the ferroelectric capacitors 238a, 238b to metal contacts added downstream in the processing. Opening 248c passes through the hydrogen barrier film 242 to reveal an upper portion of the lower metal contact 202c. The ILD layer 246 can include one or more layers of an undoped oxide, such as silicon-dioxide ($SiO_2$), a nitride, such as silicon nitride ($Si_xN_y$), a silicon-oxynitride ($Si_xO_yN_z$) or, as with the first dielectric layer 204 described above, an oxide, such as phosphosilicate glass (PSG). In one embodiment, the ILD layer 246 can include $SiO_2$ having a thickness of from about 0.40 to about 1 μm, and may be deposited by LPCVD using TEOS.

As discussed above with respect to block 114, once the ILD layer is formed, an upper surface of the ILD layer 246 is planarized using, for example, a CMP process. Openings 248a, 248b, 248c for metal contacts are etched through the ILD layer and hydrogen barrier film 242 using standard photolithographic and contact etching techniques. For example, for an $SiO_2$ ILD layer 246, a suitable contact etching technique can include forming a patterned photoresist layer on the upper surface of the ILD layer and etching the ILD layer with an etch chemistry comprising carbon-monoxide (CO), argon (Ar), octafluorocyclobutane ($C_4F_8$) or Freon® 318, and, optionally, nitrogen ($N_2$). In one embodiment, the material of the ILD layer is selected such that an etching rate of the etch stopping films 244a, 244b is less than an etching rate of the ILD layer 246. In one embodiment, the ratio of an etch rate of the ILD layer 246 and an etch rate of the etch stopping film 244a, 244b is between 2 and 15. For example, the etch stopping films 244a, 244b may composed of TiAlON. The ILD layer 246 may be composed of $SiO_2$, which etches approximately 14 times faster than TiAlON. Selecting the materials in this way may prevent electrical shorting of metal contacts and ferrocapacitor electrodes as a result of the openings 248a, 248b, 248c misalignment during photolithographic processing, as will be discussed in greater detail with reference to FIGS. 3-5.

Referring to FIG. 1 and FIG. 2H, at block 116, ILD openings 248a, 248b, 248c are filled to form upper metal contacts 250a, 250b, 250c, respectively. As with the lower metal contacts 202a, 202b, 202c described above, the upper metal contacts 250a, 250b, 250c are formed by filling the ILD openings 248a, 248b, 248c with a refractory metal, such as titanium (Ti), tantalum (Ta), tungsten (W), and nitrides or alloys thereof, by physical vapor deposition, such as sputtering, evaporation, or CVD. After filling the ILD openings 248a, 248b, 248c, upper surfaces of the upper metal contacts 250a, 250b, 250c may be planarized using, for example, a CMP process.

The upper metal contacts 250a, 250b electrically couple, via their respective ferrocapacitors 238a, 238b, between any additional upper layers added downstream in the processing (e.g., by performing subsequent processing steps) and the gate level layer 206 below. The upper metal contact 250c connects directly to the lower metal contact 202c of the gate level layer 206, forming a single metal contact that penetrates multiple levels. The upper metal contacts 250a, 250b, 250c may be wider at their upper portions than at their lower portions, which may be an artifact of the ILD etching process. A width 276 of the upper portion of the upper metal contact 250c is defined by the lithographic process used to etch the ILD openings 248a, 248b, 248c. The width 276 may be between 65 nanometers and 200 nanometers (and 186 nanometers in one embodiment), and/or may be selected according to design rules to produce a separation 274 between a lower portion of a ferrocapacitor (e.g., the ferrocapacitor 238a). In one embodiment, design rules may impose a minimum value for the separation 274 to allow for the possibility of misalignment of the upper metal contacts 250a, 250b, 250c. In one embodiment, the separation 274 (or minimum separation) is about 120 nanometers. In one embodiment, the separation 278 may be between 300 nanometers and 425 nanometers. In another embodiment, the separation 278 may be between 130 nanometers and 425 nanometers. In another embodiment, the separation 278 may be between 100 nanometers and 425 nanometers. In another embodiment, the separation 278 may be between 100 nanometers and 300 nanometers. In another embodiment, the separation 278 may be between 100 nanometers and 130 nanometers.

Figure 3A:
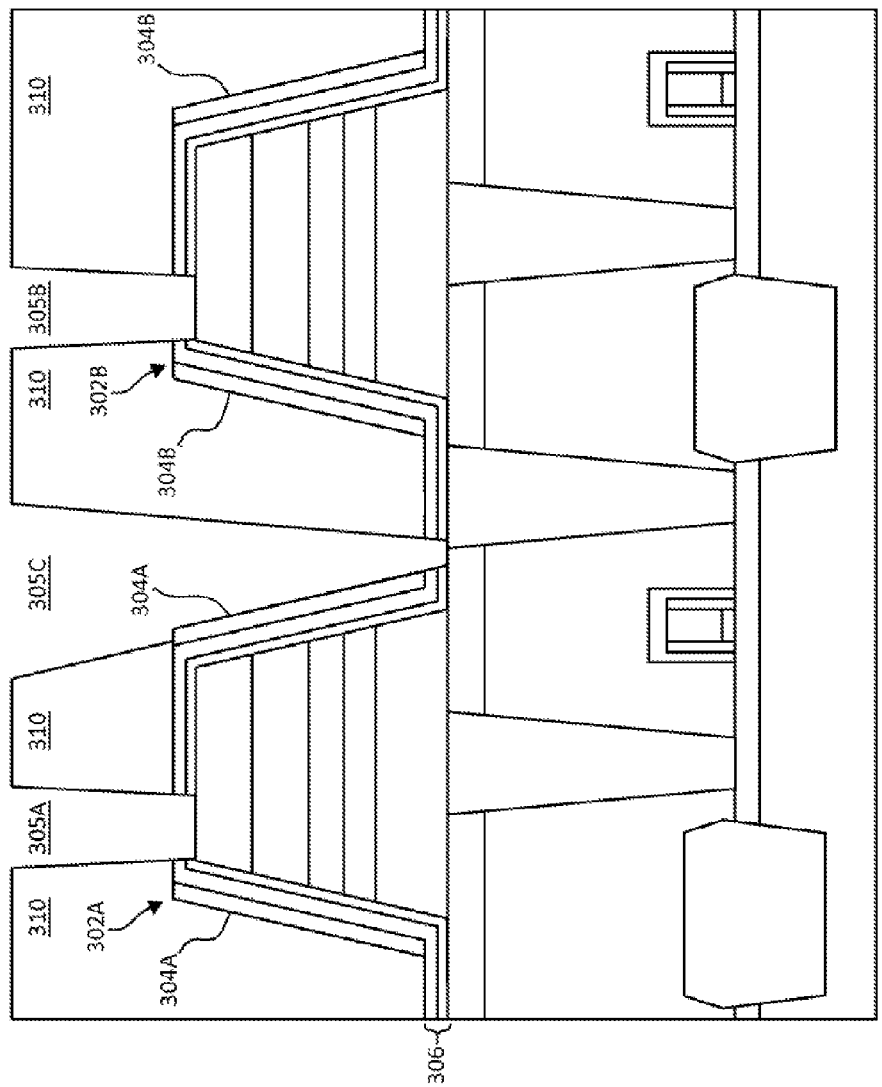
FIGS. 3A-3B illustrate cross sectional views of a misaligned metal contact in which electrical shorting is prevented during the fabrication of FRAM cells according to one embodiment of the present invention.
Figure 3B:
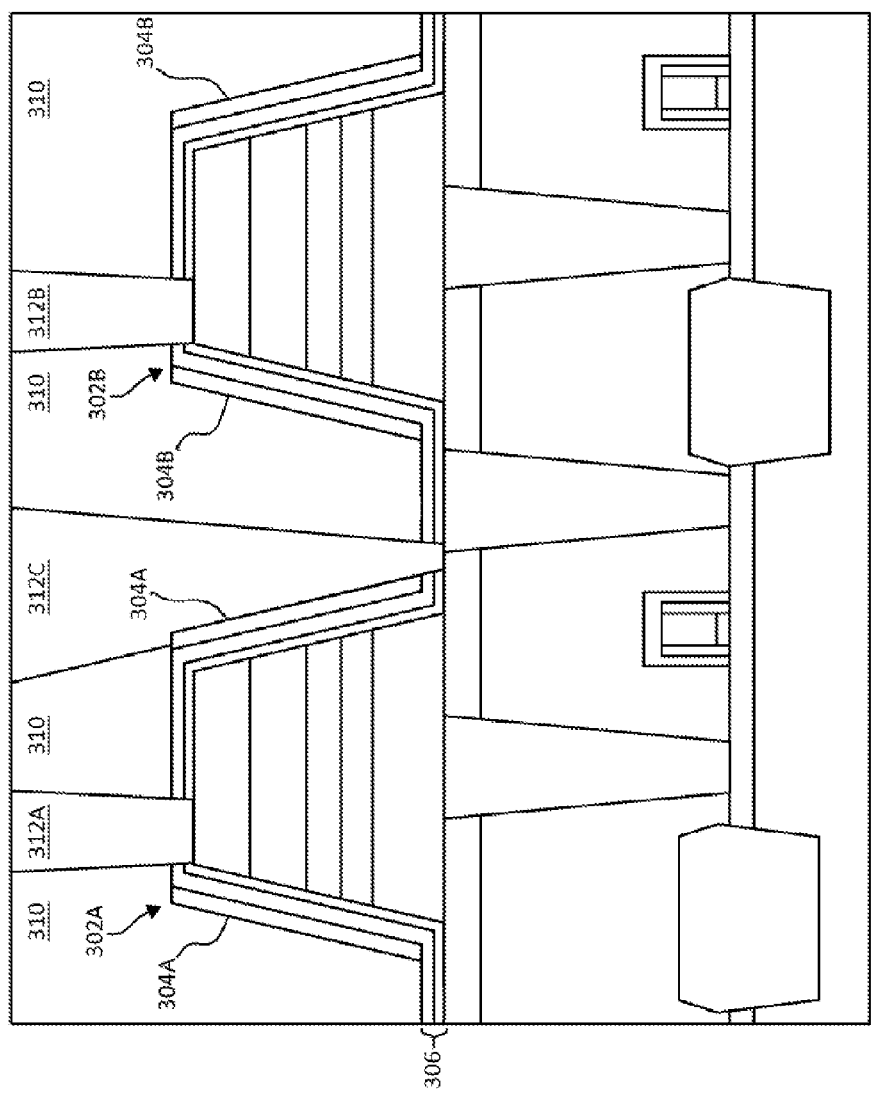

FIGS. 3A-3B illustrate cross sectional views of a misaligned metal contact in which electrical shorting is prevented during the fabrication of FRAM cells according to one embodiment of the present invention. FIG. 3A is similar to FIG. 2G, as it includes ferrocapacitors 302a, 302b having etch stopping films 304a, 304b disposed along sidewalls of the ferrocapacitors 302a, 302b, respectively, with a hydrogen barrier film 306 disposed in between. The ferrocapacitors 302a, 302b are disposed within an ILD layer 310. The structure of FIG. 3A may have been fabricated in accordance with any of the embodiments described herein, such as those described with respect to blocks 102, 104, 106, 108, 110, and 112 of FIG. 1.

In FIG. 3A, an additional process similar to that described with block 114 may have been performed, for example, by depositing a photoresist layer and performing photomask alignment and etching to for ILD openings 305a, 305b, 305c. However, FIG. 3A illustrates the scenario in which the ILD openings 305a, 305b, 305c are misaligned due to errors in the manufacturing process. If the etch rate of the ILD layer 310 exceeds that of the etch stopping films 304a, 304b (for example, by a factor 2 up to a factor of 15), the resulting openings expose outer layers of the ferrocapacitors 302a, 302b and one or more metal contacts in the layer beneath the ferrocapacitors 302a, 302b, while the interior layers of the ferrocapacitors 302a, 302b are protected by the etch stopping films 304a, 304b during the etching process. In one embodiment, the etch stopping films 304a, 304b may be etched minimally during the formation of the ILD openings 305a, 305b, 305c.

In FIG. 3B, metal contacts 312a, 312b, 312c are formed in the ILD openings 305a, 305b, 305c using a similar process as described with respect to block 116 of FIG. 1. As shown, an edge of the metal contact 312c is separated from a sidewall of the ferrocapacitor 302a by a minimum distance equal to the combined thickness of the etch stopping film 304a and the hydrogen barrier film 306. For example, the minimum distance may be between 20 nanometers and 120 nanometers.

Figure 4:
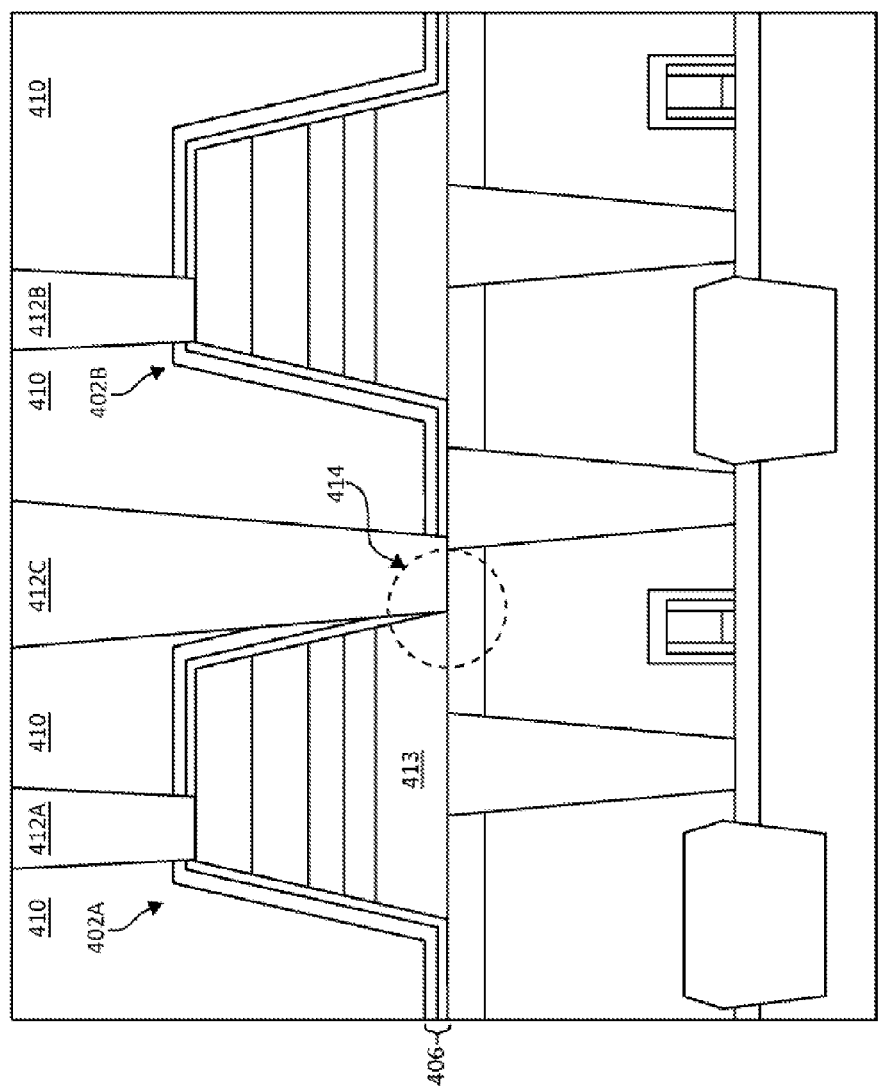
FIG. 4 illustrates a cross sectional view of a misaligned metal contact that results in electrical shorting during the fabrication of FRAM cells.

FIG. 4 illustrates a cross sectional view of a misaligned metal contact that results in electrical shorting during the fabrication of PRAM cells. The structure depicted in FIG. 4 may have been fabricated in a similar fashion as those of FIGS. 2 and 3, except without performing blocks 110 and 112. Accordingly, FIG. 4 depicts a structure having ferrocapacitors 402a, 402b, with a hydrogen barrier 406 disposed thereon, disposed within an ILD layer 410, but with no etch stopping film disposed along the sidewalls of the ferrocapacitors 402a, 402b. Misaligned etching of the ILD layer 410 and filling of the openings with metal contacts 412a, 412b, 412c is performed in a similar fashion described with respect to FIG. 3. However, as depicted in FIG. 4, the lack of an etch stopping film in accordance with the enclosed embodiments may lead to electrical shorting indicated by dashed circle 414 between the metal contact 412c and a conductive layer 413 of one of the ferrocapacitors 402a. The conductive layer 413 may be the same or similar to the $O_2$ barrier 234a described with respect to FIG. 2.

Figure 5A:
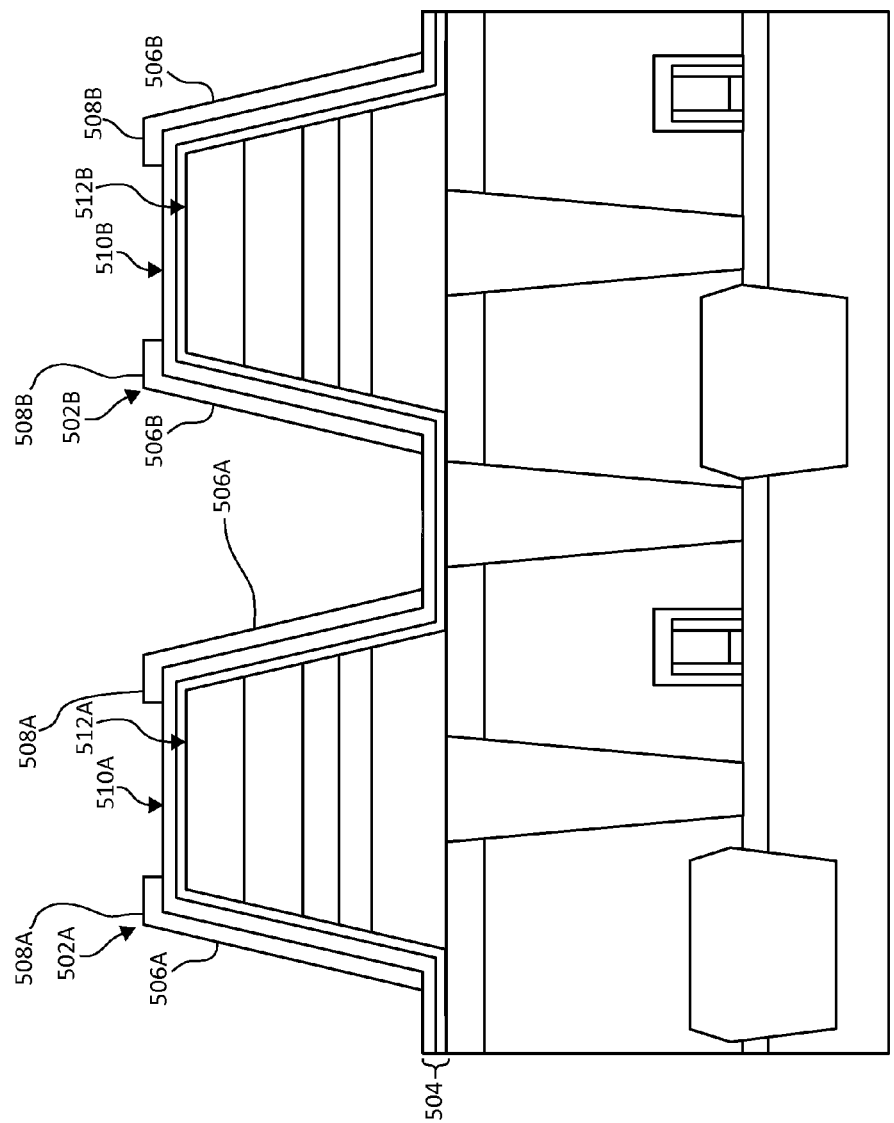
FIG. 5A illustrates a cross sectional view of an alternative embodiment of the present invention during the fabrication of FRAM cells.

FIG. 5A illustrates a cross sectional view of an alternative embodiment of the present invention during the fabrication of FRAM cells. FIG. 5A is similar to FIG. 2F, as it includes ferrocapacitors 502a, 502b having etch stopping films 506a, 506b disposed along sidewalls of the ferrocapacitors 502a, 502b, respectively, with a hydrogen barrier film 504 disposed in between. The structure of FIG. 5A may have been fabricated in accordance with any of the embodiments described herein, such as those described with respect to blocks 102, 104, 106, 108, and 110 of FIG. 1. In this embodiment, the etch stopping films 506a, 506b further include upper portions 508a, 508b disposed along upper surfaces 512a, 512b of their respective ferrocapacitors 502a, 502 and on surfaces 510a, 510b of the hydrogen barrier film 504, such that at least a portion of the etch stopping films 506a, 506b are disposed along respective upper surfaces 512a, 512b of the ferrocapacitors 502a, 502b. For example, the etch stopping films 506a, 506b having respective upper portions 508a, 508b may be fabricated by lithographic patterning, rather than performing a back etch as described with respect to block 112 of FIG. 1.

Figure 5B:
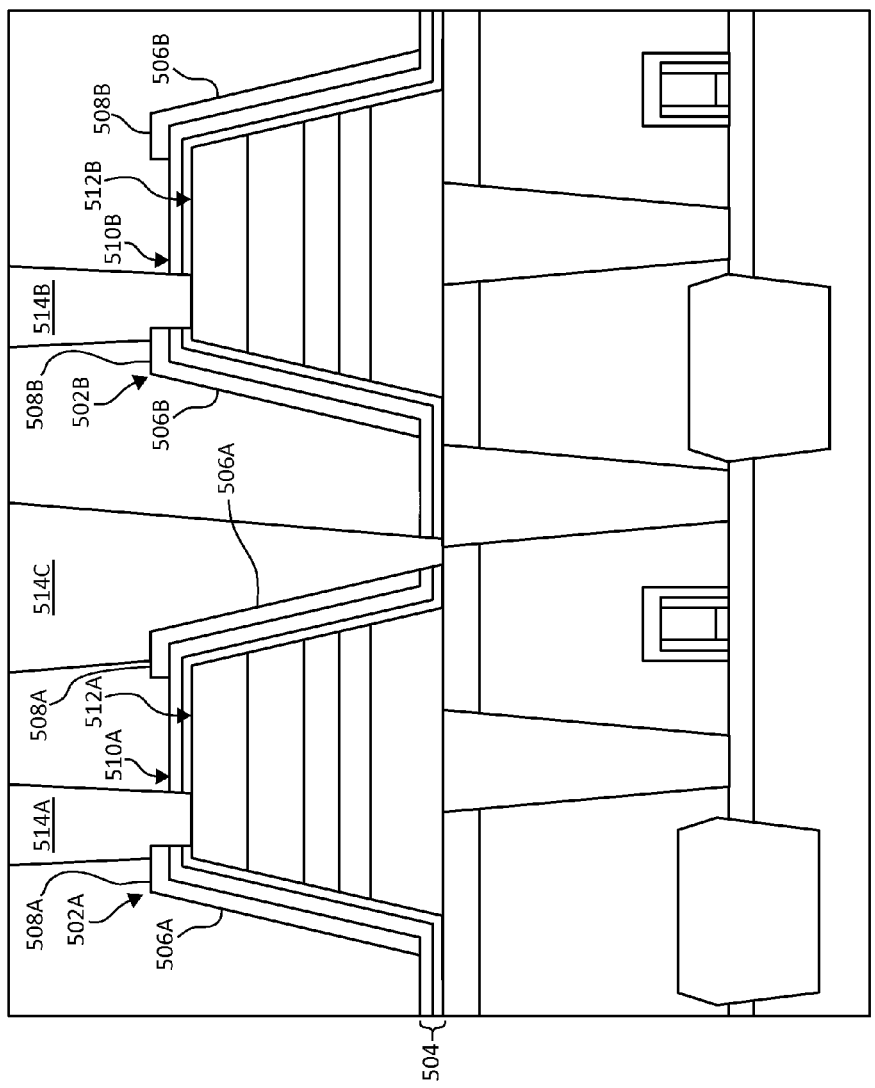
FIG. 5B illustrates a cross sectional view of the alternative embodiment of the present invention in which electrical shorting is prevented during the fabrication of FRAM cells.

FIG. 5B illustrates the effect of the upper portions 512a, 512b of the etch stopping films 506a, 506b after ILD deposition and fabrication of misaligned metal contacts. By fabricating etch stopping films 506a, 506b having upper portions 512a, 512b, this embodiment provides additional tolerance for misalignment of the central metal contact 514c. Moreover, the upper portions 512a, 512b also provide protection from shorting against misalignment of the metal contacts 514a, 514b.

The embodiments described herein utilize etch stopping films during the fabrication of FRAM cells that prevent electrical shorting due to misaligned interconnects. Use of an etch stopping film as described herein may allow for design rules to be relaxed, and ultimately a higher FRAM cell density per chip. It will be understood by those skilled in the art that these embodiments may reduce the stringency of certain design rules in order to decrease the overall dimensions of the FRAM cells, and thus increase the cell density of FRAM chips. For example, a minimum sidewall-to-sidewall distance of two ferrocapacitors may be reduced down to 100 nanometers while still maintaining high manufacturing yield standards in the event of alignment-related manufacturing errors. In one embodiment, a minimum sidewall-to-sidewall distance is at least equal to a sum of the respective thicknesses of etch stopping films disposed on the respective sidewalls of the first and second ferrocapacitors and a width of the metal contact disposed between the first and second ferrocapacitors.

Thus, embodiments of FRAM cells including etch stopping films to prevent electrical shorting during fabrication have been presented herein. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The terms "above," "under," "between," and "on" as used herein refer to a relative position of one layer with respect to other layers. As such, for example, one layer deposited or disposed above or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming the initial disk is a starting substrate and the subsequent processing deposits, modifies and removes films from the substrate without consideration of the absolute orientation of the substrate. Thus, a film that is deposited on both sides of a substrate is "over" both sides of the substrate.

In the foregoing description, numerous specific details are set forth, such as specific materials, dimensions, processes parameters, etc., to provide a thorough understanding of the present invention. In some instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" or "in one embodiments" in various places throughout this specification are not necessarily referring to the same embodiment of the invention. Furthermore, the particular features, structures, materials, or characteristics may be combined in any suitable manner in one or more embodiments.

The present invention has been described with reference to specific exemplary embodiments thereof. It will, however, be evident that various modifications and changes may be made thereto without departing from the broader scope of the embodiments of the invention as set for in the appended claims. The specification and drawings are, accordingly, to be regarded in an illustrative rather than a restrictive sense.

What is claimed is:

1. An apparatus comprising:
a first ferrocapacitor having a first sidewall;
a hydrogen barrier film disposed along the first sidewall of the first ferrocapacitor, the hydrogen barrier film having an outer surface and an inner surface, wherein the inner surface of the hydrogen barrier film is in contact with the first sidewall of the ferrocapacitor; and
an etch stopping film disposed along the outer surface of the hydrogen barrier film,
wherein the etch stopping film comprises titanium aluminum oxy-nitride (TiAlON), and wherein a nitrogen to oxygen ratio varies along a direction from an inner surface of the etch stopping film to an outer surface of the etch stopping film.

2. The apparatus of claim 1, wherein the etch stopping film comprises at least one of silicon nitride (SiN), silicon oxy-nitride (SiON), titanium oxy-nitride (TiON), or titanium aluminum oxy-nitride (TiAlON).

3. The apparatus of claim 1, wherein a thickness of the etch stopping film is between 10 nanometers and 100 nanometers.

4. The apparatus of claim 1, wherein the first ferrocapacitor is disposed within a dielectric material.

5. The apparatus of claim 4, wherein a first etch rate of the etch stopping film is less than a second etch rate of the dielectric material.

6. The apparatus of claim 5, wherein a ratio of the second etch rate of the dielectric material to the first etch rate of the etch stopping film is between 2 and 15.

7. The apparatus of claim 1, wherein a first portion of the hydrogen barrier film is disposed along an upper surface of the ferrocapacitor, and a second portion of the etch stopping film is disposed along the first portion of the hydrogen barrier film which is disposed along the upper surface of the ferrocapacitor.

8. The apparatus of claim 1, further comprising a metal contact disposed adjacent to the first ferrocapacitor and separated from the first ferrocapacitor by a dielectric material, wherein a minimum distance between the first sidewall of the first ferrocapacitor and an edge of the metal contact is between 20 nanometers and 120 nanometers.

9. The apparatus of claim 8, wherein the minimum distance is about equal to a combined thickness of the hydrogen barrier film and the etch stopping film.

10. The apparatus of claim 1, wherein a first lower surface of the first ferrocapacitor is disposed along a dielectric layer.

11. The apparatus of claim 10, further comprising:
a second ferrocapacitor having a second sidewall and a second lower surface, wherein the second lower surface of the second ferrocapacitor is disposed along the dielectric layer; and
a metal contact disposed between the first sidewall of the first ferrocapacitor and the second sidewall of the second ferrocapacitor, wherein a minimum distance between the first sidewall of the first ferrocapacitor and the second sidewall of the second ferrocapacitor is between 100 nanometers and 425 nanometers.

12. The apparatus of claim 1, wherein the hydrogen barrier film comprises two or more layers.

13. The apparatus of claim 1, wherein the etch stopping film comprises two or more layers.

14. An apparatus comprising:
a memory, the memory comprising:
a first ferrocapacitor having a sidewall;
a hydrogen barrier film disposed along the sidewall of the first ferrocapacitor, the hydrogen barrier film having an outer surface and an inner surface, wherein the inner surface of the hydrogen barrier film is in contact with the sidewall of the ferrocapacitor; and
an etch stopping film disposed along the outer surface of the hydrogen barrier film,
wherein the etch stopping film comprises an oxy-nitride and wherein a nitrogen to oxygen ratio varies along a direction from an inner surface of the etch stopping film to an outer surface of the etch stopping film.

15. The apparatus of claim 14, wherein the memory is a ferroelectric random-access memory (PRAM).

16. The apparatus of claim 14, wherein the oxy-nitride of the etch stopping film comprises titanium aluminum oxy-nitride (TiAlON).

17. An apparatus comprising:
a ferrocapacitor formed on a substrate, the ferrocapacitor having a sidewall and an upper surface;
a hydrogen barrier film disposed on the sidewall and upper surface of the ferrocapacitor and on a surface of the substrate;
an etch stopping film disposed on an outer surface of the hydrogen barrier film overlying the sidewall of the ferrocapacitor;
an interlevel dielectric (ILD) disposed over the ferrocapacitor covering the hydrogen barrier film, etch stopping film and surface of the substrate; and
a first metal contact formed in a first contact opening extending through the ILD and the hydrogen barrier film to a lower metal contact formed on the surface of the substrate,
wherein the first contact opening exposes but does not extend through the etch stopping film covering the outer surface of the hydrogen barrier film overlying the sidewall of the ferrocapacitor.

18. The apparatus of claim 17, wherein the etch stopping film is further disposed on a first portion of the upper surface of the ferrocapacitor, and further comprising a second metal contact formed in a second contact opening extending through the ILD and the hydrogen barrier film to the upper surface of the ferrocapacitor not covered by the etch stopping film,
wherein the second contact opening exposes but does not extend through the etch stopping film covering the first portion of the upper surface of the ferrocapacitor.

19. The apparatus of claim 17, wherein the etch stopping film comprises titanium aluminum oxy-nitride (TiAlON), and wherein a nitrogen to oxygen ratio varies along a direction from an inner surface of the etch stopping film to an outer surface of the etch stopping film.

* * * * *